US011031425B2

(12) United States Patent
Seo et al.

(10) Patent No.: US 11,031,425 B2
(45) Date of Patent: Jun. 8, 2021

(54) IMAGE SENSOR AND METHOD OF MANUFACTURING THE SAME

(71) Applicant: Samsung Electronics Co., Ltd., Suwon-si (KR)

(72) Inventors: Jae-Kwan Seo, Hwaseong-si (KR); Kookki Lee, Yongin-si (KR); Dohoon Kim, Yongin-si (KR); Changrai Kim, Yongin-si (KR); Joonghoon Lee, Hwaseong-si (KR); Eunsang Cho, Yongin-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 37 days.

(21) Appl. No.: 16/430,791

(22) Filed: Jun. 4, 2019

(65) Prior Publication Data

US 2020/0144320 A1 May 7, 2020

(30) Foreign Application Priority Data

Nov. 5, 2018 (KR) ........................ 10-2018-0134233

(51) Int. Cl.
*H01L 31/0232* (2014.01)
*H01L 27/146* (2006.01)

(52) U.S. Cl.
CPC .... *H01L 27/14627* (2013.01); *H01L 27/1462* (2013.01); *H01L 27/14621* (2013.01); *H01L 27/14623* (2013.01); *H01L 27/14636* (2013.01); *H01L 27/14685* (2013.01)

(58) Field of Classification Search
CPC ........... H01L 27/14621; H01L 27/1462; H01L 27/14627
See application file for complete search history.

(56) References Cited

U.S. PATENT DOCUMENTS

| 7,268,009 | B2 | 9/2007 | Hwang |
| 7,829,371 | B2 | 11/2010 | Ryu |
| 7,851,789 | B2 | 12/2010 | Lee et al. |
| 9,653,508 | B2 | 5/2017 | Lin et al. |
| 9,837,463 | B2 | 12/2017 | Tamaki et al. |
| 2016/0057320 | A1* | 2/2016 | Akiyama .......... H01L 27/14627 348/308 |
| 2018/0026068 | A1 | 1/2018 | Ogi et al. |

FOREIGN PATENT DOCUMENTS

| JP | 2016-219468 A | 12/2016 |
| JP | 6295983 B2 | 3/2018 |
| KR | 2000-0032734 A | 6/2000 |
| KR | 10-0504563 B1 | 7/2005 |
| KR | 10-0894390 B1 | 4/2009 |
| KR | 10-0918691 B1 | 9/2009 |
| KR | 10-0947929 B1 | 3/2010 |
| KR | 10-0982960 B1 | 9/2010 |
| KR | 2011-0024471 A | 3/2011 |
| KR | 10-1430793 B1 | 8/2014 |

* cited by examiner

*Primary Examiner* — Samuel A Gebremariam
(74) *Attorney, Agent, or Firm* — Harness, Dickey & Pierce, P.L.C.

(57) ABSTRACT

An image sensor includes a substrate including a pixel region and a pad region, a first conductive pad on the substrate in the pad region, a micro lens layer on the substrate in the pixel region, and a first protective pattern covering the pad region and exposing the first conductive pad. The first protective pattern and the micro lens layer include the same material, and the first protective pattern and the micro lens layer are apart from each other.

19 Claims, 15 Drawing Sheets

IMAGE SENSOR AND METHOD OF MANUFACTURING THE SAME

CROSS-REFERENCE TO RELATED APPLICATION

This U.S. non-provisional patent application claims priority under 35 U.S.C. § 119 to Korean Patent Application No. 10-2018-0134233, filed on Nov. 5, 2018, in the Korean Intellectual Property Office, the disclosure of which is hereby incorporated by reference in its entirety.

BACKGROUND

Embodiments of the inventive concepts relate to an image sensor and a method of manufacturing the same.

Image sensors are semiconductor devices for converting optical images into electrical signals. Image sensors may be categorized as any one of charge coupled device (CCD) image sensors and complementary metal-oxide-semiconductor (CMOS) image sensors. CIS is short for the CMOS image sensor. The CIS may include a plurality of pixels two-dimensionally arranged. Each of the pixels may include a photodiode (PD). The photodiode may convert incident light into an electrical signal.

SUMMARY

Embodiments of the inventive concepts may provide an image sensor capable of minimizing or preventing an image defect.

Embodiments of the inventive concepts may also provide a method of manufacturing an image sensor, which is capable of simplifying processes.

In an aspect, an image sensor may include a substrate including a pixel region and a pad region and including a first surface and a second surface opposite to each other, a first conductive pad on the second surface of the substrate in the pad region, a micro lens layer on the second surface of the substrate in the pixel region, and a first protective pattern covering the pad region and exposing the first conductive pad. The first protective pattern and the micro lens layer may include the same material, and the first protective pattern and the micro lens layer may be apart from each other.

In an aspect, an image sensor may include a substrate including a pixel region, an optical black region, and a pad region, a first conductive pad on the substrate in the pad region, a micro lens layer on the substrate in the pixel region, a first protective pattern covering the pad region and exposing the first conductive pad, and a second protective pattern on the substrate in the optical black region. The first protective pattern and the second protective pattern may be transparent.

In an aspect, an image sensor may include a substrate including a pixel region and a pad region, a first conductive pad on the substrate in the pad region, a micro lens layer on the substrate in the pixel region, and a first protective pattern covering the pad region and exposing the first conductive pad. The first protective pattern may be apart from the micro lens layer, and the first protective pattern may be transparent.

In an aspect, a method of manufacturing an image sensor may include preparing a substrate including a pad region and a pixel region, forming a first conductive pad on the substrate in the pad region, forming a preliminary lens layer covering the pad region and the pixel region, etching an upper portion of the preliminary lens layer in the pixel region to form a plurality of lens portions, and etching the preliminary lens layer between the pad region and the pixel region to form a first protective pattern covering the pad region and a micro lens layer covering the pixel region.

BRIEF DESCRIPTION OF THE DRAWINGS

The inventive concepts will become more apparent in view of the attached drawings and accompanying detailed description.

DETAILED DESCRIPTION OF THE EMBODIMENTS

Hereinafter, embodiments of the inventive concepts will be described in more detail with reference to the accompanying drawings.

Figure 1:
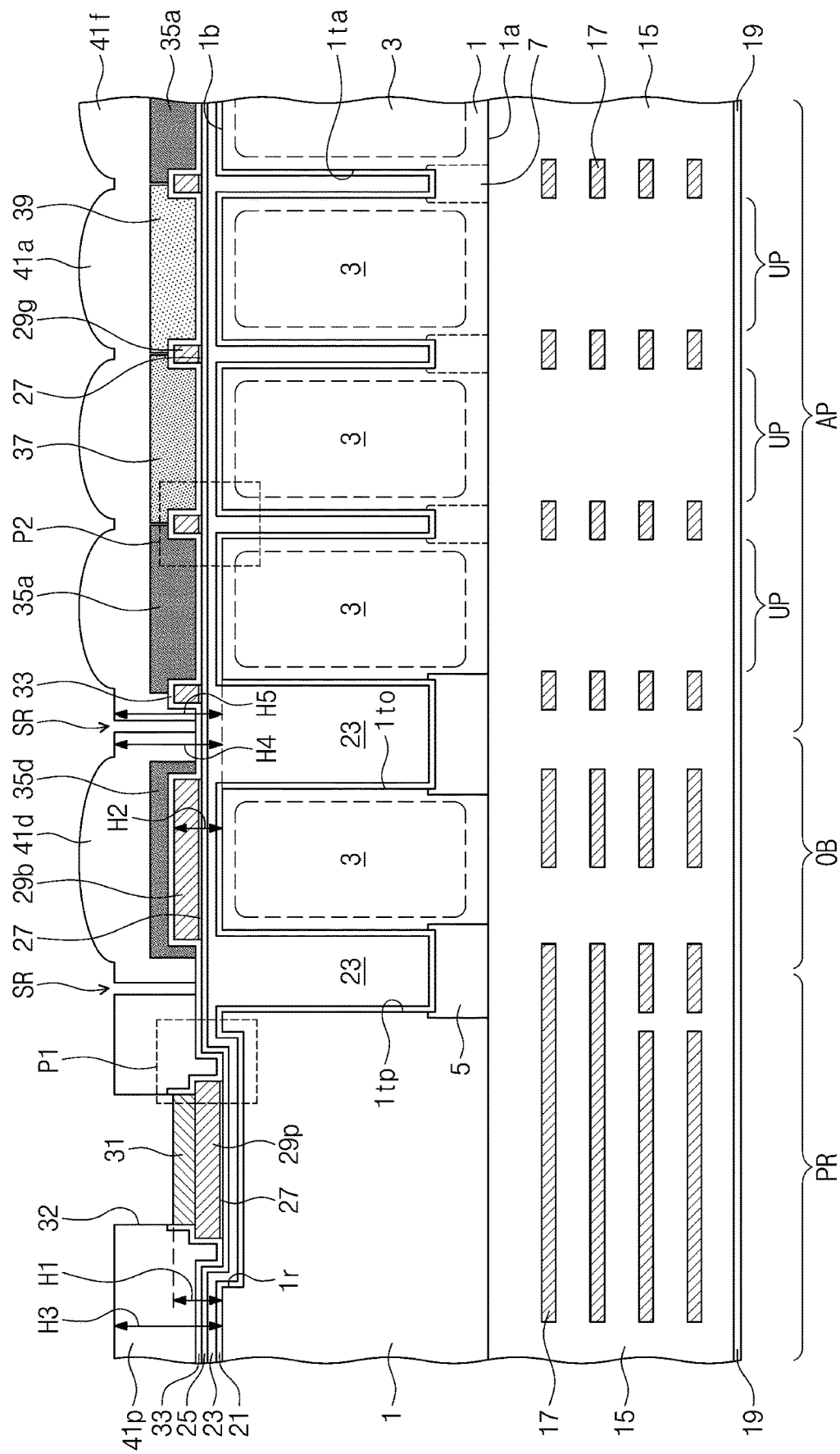
FIG. 1 is a cross-sectional view illustrating an image sensor according to some embodiments of the inventive concepts.

FIG. 1 is a cross-sectional view illustrating an image sensor according to some embodiments of the inventive concepts.

Referring to FIG. 1, a substrate 1 including a pad region PR, an optical black region OB, and/or a pixel region AP may be provided. The substrate 1 may include a first surface 1a and a second surface 1b opposite to each other. For example, the substrate 1 may be a single-crystalline silicon wafer, a silicon epitaxial layer, or a silicon-on-insulator (SOI) substrate. For example, the substrate 1 may be doped with dopants of a first conductivity type. For example, the first conductivity type may be a P-type.

The pixel region AP may include a plurality of unit pixels UP. A photoelectric conversion portion 3 may be in the substrate 1 in each of the unit pixels UP. A photoelectric conversion portion 3 may also be in the substrate 1 in the optical black region OB. For example, the photoelectric conversion portion 3 may be doped with dopants of a second conductivity type opposite to the first conductivity type. The second conductivity type may be, for example, an N-type. The N-type dopants included in the photoelectric conversion portion 3 may form a PN junction with the P-type dopants included in the substrate 1 around the photoelectric conversion portion 3, and thus a photodiode may be provided.

Light may be incident into the substrate 1 through the second surface 1b of the substrate 1. Electron-hole pairs (EHPs) may be generated in a depletion region of the PN junction by the incident light. Although not shown in the drawings, transfer transistors, reset transistors, selection transistors and/or source follower transistors, which are used to transfer electrons generated by the incident light, may be on the first surface 1a of the substrate 1 of the pixel region AP. The image sensor may be a backside illuminated image sensor.

The first surface 1a may be covered with an interlayer insulating layer 15. The interlayer insulating layer 15 may be a multi-layer, each layer of which includes at least one of a silicon oxide layer, a silicon nitride layer, a silicon oxynitride layer, or a porous low-k dielectric layer. Interconnection lines 17 may be in the interlayer insulating layer 15. A bottom surface of the interlayer insulating layer 15 may be covered with a first passivation layer 19. For example, the first passivation layer 19 may be formed of a silicon nitride layer and/or a polyimide layer.

In the pixel region AP, first deep trenches 1ta may be formed in the substrate 1 to isolate the unit pixels UP from each other. The first deep trenches 1ta may intersect each other to constitute a mesh structure, when viewed in a plan view. A second deep trench 1to may be formed in the substrate 1 between the pixel region AP and the optical black region OB. A third deep trench 1tp may be formed in the substrate 1 between the optical black region OB and the pad region PR. Widths of the second and third deep trenches 1to and 1tp may be greater than a width of the first deep trenches 1ta.

The first to third deep trenches 1ta, 1to and 1tp may extend from the second surface 1b of the substrate 1 toward the first surface 1a of the substrate 1. In the pad region PR, a recess region 1r may be formed from the second surface 1b of the substrate 1. The recess region 1r may be shallower than the first to third deep trenches 1ta, 1to and 1tp.

A shallow device isolation pattern 5 may be between the second deep trench 1to and the first surface 1a of the substrate 1 and between the third deep trench 1tp and the first surface 1a of the substrate 1. The shallow device isolation pattern 5 may have a single-layered or multi-layered structure including at least one of a silicon nitride layer, a silicon oxide layer, or a silicon oxynitride layer. The shallow device isolation pattern 5 may be formed between the pad region PR and the optical black region OB and between the optical black region OB and the pixel region AP.

In the pixel region AP, a device isolation region 7 may be between the first deep trench 1ta and the first surface 1a of the substrate 1. The device isolation region 7 may be doped with dopants of, for example, the first conductivity type, and a concentration of the dopants of the device isolation region 7 may be higher than a concentration of the dopants of the substrate 1. In the pixel region AP, the device isolation region 7 may be adjacent to the first surface 1a and may isolate the unit pixels UP from each other. In addition, the device isolation region 7 may define active regions for the transfer transistors, the reset transistors, the selection transistors, and the source follower transistors.

A fixed charge layer 21, a filling insulation layer 23 and/or an adhesive layer 25 may be sequentially stacked on the second surface 1b of the substrate 1. The fixed charge layer 21 may include a metal oxide layer containing insufficient oxygen in terms of a stoichiometric ratio or a metal fluoride layer containing insufficient fluorine in terms of a stoichiometric ratio. Thus, the fixed charge layer 21 may have negative fixed charges. The fixed charge layer 21 may include a metal oxide layer or metal fluoride layer including at least one of hafnium (Hf), zirconium (Zr), aluminum (Al), tantalum (Ta), titanium (Ti), yttrium (Y), or a lanthanoid. Holes may be accumulated in the vicinity of the fixed charge layer 21. Thus, a dark current and a white spot may be effectively reduced. In particular, the fixed charge layer 21 may include at least one of an aluminum oxide layer or a hafnium oxide layer. The fixed charge layer 21 may be in contact with the substrate 1. The filling insulation layer 23 may be formed of a silicon oxide-based material having an excellent filling characteristic. The adhesive layer 25 may be an aluminum oxide layer.

The fixed charge layer 21 may be conformally formed on the second surface 1b of the substrate 1. The fixed charge layer 21 may be in contact with bottom surfaces and sidewalls of the recess region 1r and the first to third deep trenches 1ta, 1to and 1tp. The filling insulation layer 23 may fill the first to third deep trenches 1ta, 1to and 1tp. The fixed charge layer 21 and the filling insulation layer 23 which are in the first to third deep trenches 1ta, 1to and 1tp may constitute deep device isolation patterns. In the pixel region AP, the fixed charge layer 21 and the filling insulation layer 23 in the first deep trench 1ta may isolate the unit pixels UP from each other. The filling insulation layer 23 may conformally cover the bottom surface and the sidewall of the recess region 1r.

In the pad region PR, a first conductive pad 29p may be on the adhesive layer 25. The first conductive pad 29p may vertically overlap with the recess region 1r. The first conductive pad 29p may be in the recess region 1r. A second conductive pad 31 may be on the first conductive pad 29p. A width of the second conductive pad 31 may be less than a width of the first conductive pad 29p. Thus, a portion of a top surface of the first conductive pad 29p may not be covered with the second conductive pad 31 but may be exposed. Although not shown in the drawings, the first conductive pad 29p may be electrically connected to one of the interconnection lines 17 through a through-via or via plug penetrating the substrate 1.

Although not shown in the drawings, a transfer transistor, a reset transistor, a selection transistor and/or a source follower transistor may also be on the first surface 1a of the substrate 1 in the optical black region OB.

In the optical black region OB, a first optical black pattern 29b may be on the adhesive layer 25. In the pixel region AP, light blocking patterns 29g may be on the adhesive layer 25 between the unit pixels UP. The light blocking patterns 29g may intersect each other to constitute a mesh structure, when viewed in a plan view. The first conductive pad 29p, the first optical black pattern 29b and the light blocking patterns 29g may be formed of the same material (e.g., tungsten). The first conductive pad 29p, the first optical black pattern 29b and the light blocking patterns 29g may have the same thickness. The second conductive pad 31 may be formed of a different material (e.g., aluminum) from that of the first conductive pad 29p.

In the optical black region OB, the first optical black pattern 29b may be used to block light. The amount of charges sensed from the optical black region OB in which light is blocked may be defined as a reference charge amount. In other words, unit pixel charge amounts sensed from the unit pixels UP may be compared with the reference charge amount to calculate difference values between the reference charge amount and the unit pixel charge amounts, and thus a magnitude of an electrical signal sensed from each of the unit pixels UP may be calculated.

A barrier layer 27 may be between the first conductive pad 29p and the adhesive layer 25, between the first optical black pattern 29b and the adhesive layer 25, and between each of the light blocking patterns 29g and the adhesive layer 25. The barrier layer 27 may be, for example, a silicon nitride layer.

A second passivation layer 33 may cover top surfaces and sidewalls of the first optical black pattern 29b and the light blocking patterns 29g and sidewalls of the first and second conductive pads 29p and 31. The second passivation layer 33 may be, for example, a silicon nitride layer. The second passivation layer 33 may extend to cover the adhesive layer 25 exposed among the first conductive pad 29p, the first optical black pattern 29b and the light blocking patterns 29g.

In the pixel region AP, color filters 35a, 37 and 39 may be on the second passivation layer 33 between the light blocking patterns 29g. The color filters 35a, 37 and 39 may include first to third color filters 35a, 37 and 39 having different colors. For example, the first color filter 35a may have a blue color. The second color filter 37 may have a red color. The third color filter 39 may have a green color.

When the image sensor of the inventive concepts is an auto-focus image sensor, the image sensor may further include a color filter of a transparent color. In some embodiments, a width of one of the light blocking patterns 29g may be greater than a width of another of the light blocking patterns 29g.

Alternatively, when the image sensor of the inventive concepts is an image sensor capable of sensing infrared light, the image sensor may further include an infrared filter.

In the optical black region OB, a second optical black pattern 35d may be on the second passivation layer 33. The second optical black pattern 35d may overlap with the first optical black pattern 29b. The second passivation layer 33 may be between the first optical black pattern 29b and the second optical black pattern 35d. A width of the second optical black pattern 35d may be greater than a width of the first optical black pattern 29b. The second optical black pattern 35d may cover the top surface and the sidewall of the first optical black pattern 29b. The second passivation layer 33 may be exposed at both sides of the second optical black pattern 35d.

The second optical black pattern 35d may include the same material as the first color filter 35a. For example, the second optical black pattern 35d may have a blue color. The second optical black pattern 35d may be a photoresist pattern including a blue pigment. The second optical black pattern 35d may also be used to block light. The second optical black pattern 35d may compensate the light blocking function of the first optical black pattern 29b.

Since a portion of the substrate 1 is recessed by the recess region 1r, heights (or levels) of top surfaces of the layers 21, 23, 25 and 27 located under the second conductive pad 31 may be lower than heights (or levels) of top surfaces of the layers 21, 23, 25 and 27 located in other regions OB and AP. Thus, a height of a top surface of the second conductive pad 31 may be lower than heights of top surfaces of the first to third color filters 35a, 37 and 39. In particular, a first height H1 of the top surface of the second conductive pad 31 may be the same as a second height H2 of the top surface of the first optical black pattern 29b. In addition, the first height H1 of the top surface of the second conductive pad 31 may be the same as a height of the top surfaces of the light blocking patterns 29g. As a result, a height difference between the pad region PR and other regions OB and AP may be reduced or eliminated in a process of forming the first to third color filters 35a, 37 and 39, and thus the first to third color filters 35a, 37 and 39 may be more accurately formed.

In the pixel region AP, a micro lens layer 41f may be on the first to third color filters 35a, 37 and 39. An upper portion of the micro lens layer 41f may include lens portions 41a which are convex and correspond to positions of the first to third color filters 35a, 37 and 39, respectively. In the pad region PR, a first protective pattern 41p may be on the second passivation layer 33. The first protective pattern 41p may have an opening 32 exposing the top surface of the second conductive pad 31. In the optical black region OB, a second protective pattern 41d may be on the second optical black pattern 35d. The micro lens layer 41f, the first protective pattern 41p and the second protective pattern 41d may include the same material. For example, the micro lens layer 41f, the first protective pattern 41p and the second protective pattern 41d may be formed of a transparent photoresist material or a transparent thermosetting resin. The micro lens layer 41f, the first protective pattern 41p and the second protective pattern 41d may be apart from each other by a separation region SR. The second passivation layer 33 may be exposed through the separation region SR.

A top surface of the first protective pattern 41p may have a third height H3 from the second surface 1b of the substrate 1. A top end of an edge of the second protective pattern 41d may have a fourth height H4 from the second surface 1b of the substrate 1. A top end of an edge of the micro lens layer 41f may have a fifth height H5 from the second surface 1b of the substrate 1. In some embodiments, the third to fifth heights H3, H4 and H5 may be the same as each other.

Figure 2:
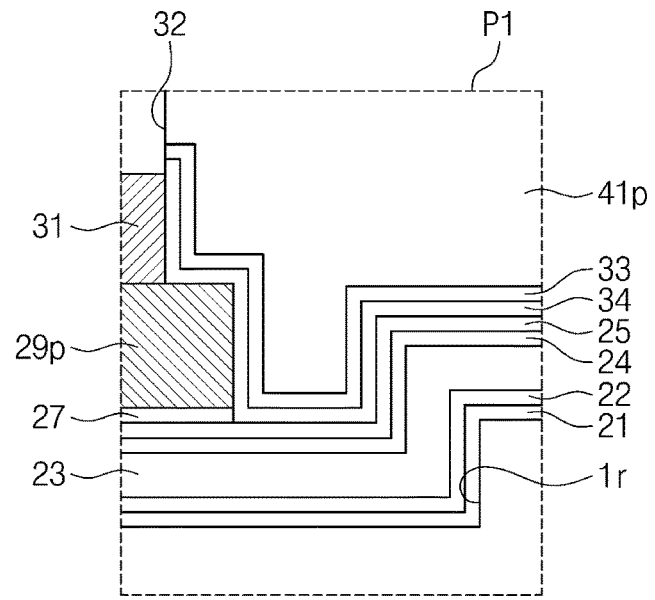
FIG. 2 is an enlarged view of a portion 'P1' of FIG. 1, according to some embodiments of the inventive concepts.
Figure 3:
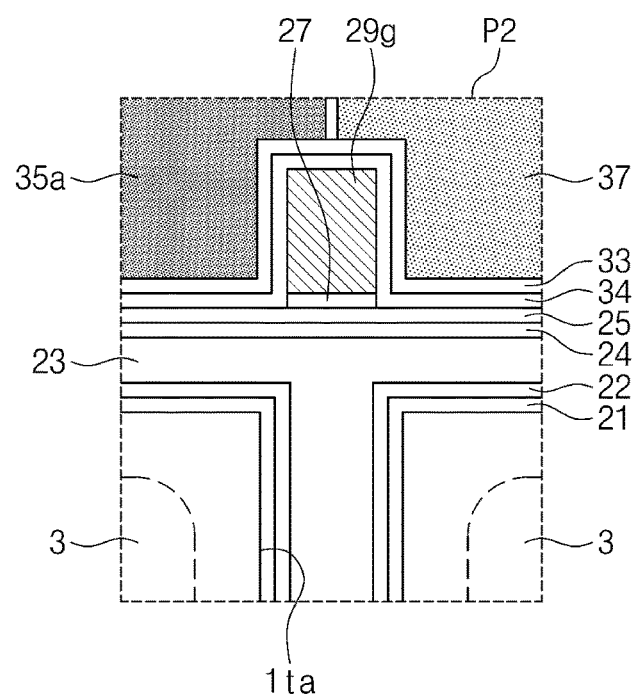
FIGS. 3 to 5 are enlarged views of a portion 'P2' of FIG. 1, according to some embodiments of the inventive concepts.
Figure 4:
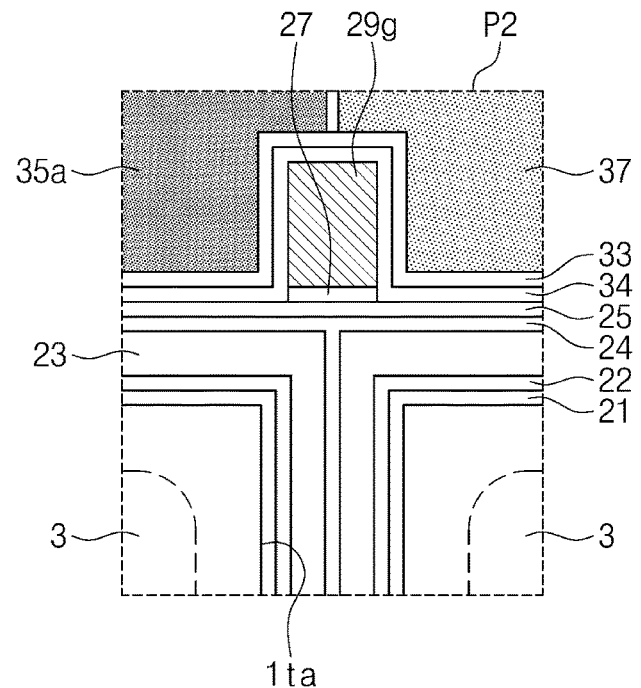
Figure 5:
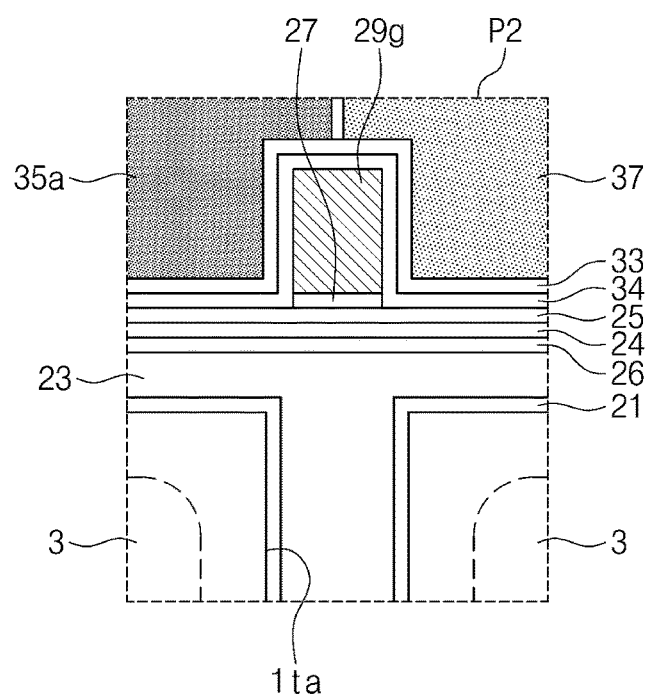

FIG. 2 is an enlarged view of a portion 'P1' of FIG. 1, according to some embodiments of the inventive concepts. FIGS. 3 to 5 are enlarged views of a portion 'P2' of FIG. 1, according to some embodiments of the inventive concepts.

As illustrated in FIGS. 2 and 3, an auxiliary fixed charge layer 22 may be between the fixed charge layer 21 and the filling insulation layer 23. The auxiliary fixed charge layer 22 may include a different material from that of the fixed charge layer 21. For example, the fixed charge layer 21 may be an aluminum oxide layer, and the auxiliary fixed charge layer 22 may be a hafnium oxide layer. In this example, the aluminum oxide layer may be in contact with the substrate 1. A first auxiliary adhesive layer 24 may be between the filling insulation layer 23 and the adhesive layer 25. The first auxiliary adhesive layer 24 may be, for example, a hafnium oxide layer. A second auxiliary adhesive layer 34 may be between the second passivation layer 33 and the sidewall of the first conductive pad 29p. The second auxiliary adhesive layer 34 may be, for example, an aluminum oxide layer. The second auxiliary adhesive layer 34 may improve adhesive strength between the second passivation layer 33 and the conductive pads 29p and 31.

In certain embodiments, like FIG. 4, a portion of the first auxiliary adhesive layer 24 may extend into the first deep trench 1ta. The first auxiliary adhesive layer 24 may reduce or prevent cross-talk between the unit pixels UP adjacent to each other.

In certain embodiments, like FIG. 5, the auxiliary fixed charge layer 22 may not exist between the fixed charge layer 21 and the filling insulation layer 23. In some embodiments, the filling insulation layer 23 may be a hafnium oxide layer. In some embodiments, an auxiliary insulating layer 26 may be additionally between the filling insulation layer 23 and the first auxiliary adhesive layer 24. The auxiliary insulating layer 26 may be, for example, a silicon nitride layer.

FIGS. 6 to 12 are cross-sectional views illustrating a method of manufacturing the image sensor of FIG. 1.

Figure 6:
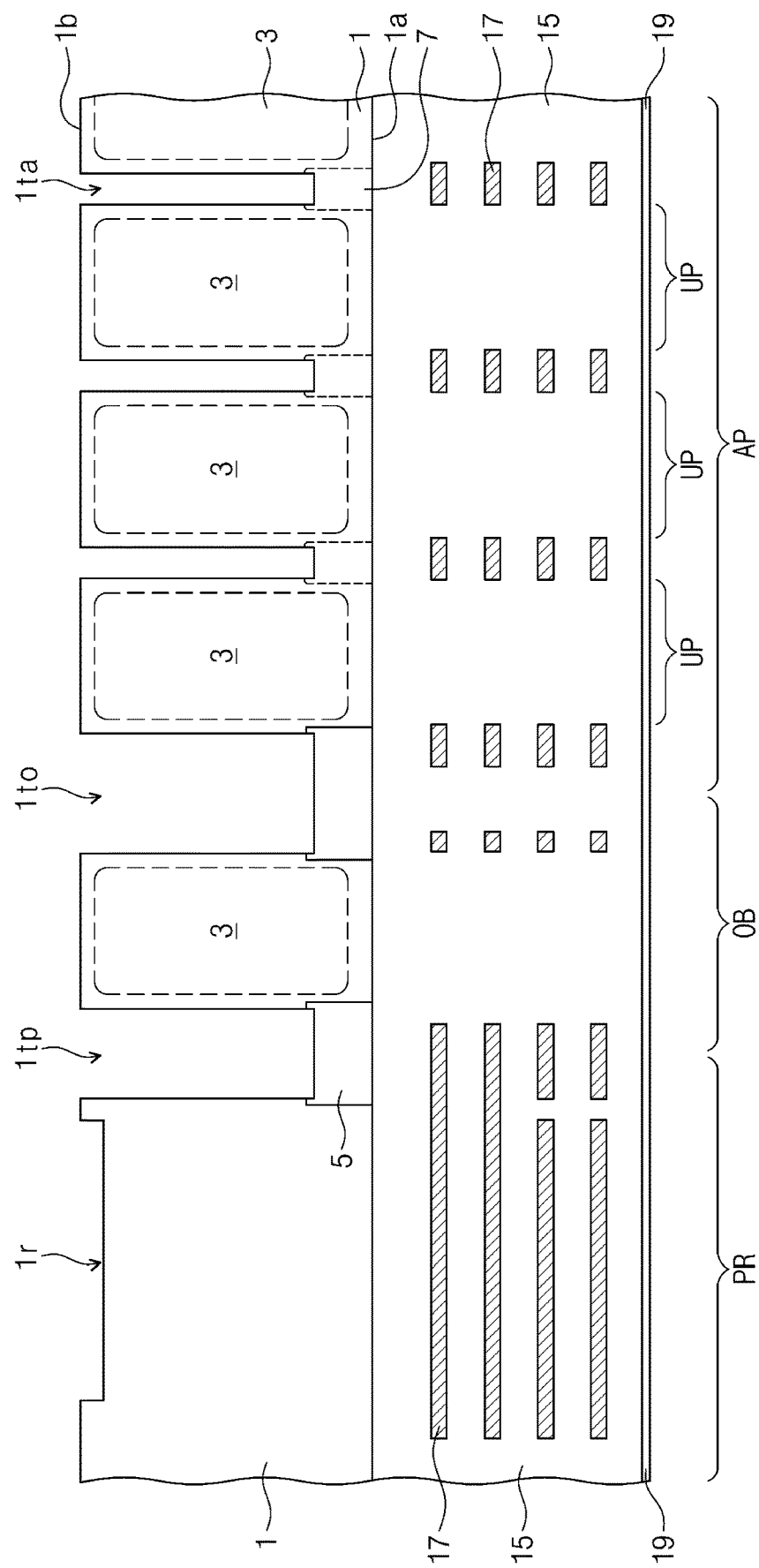
FIGS. 6 to 12 are cross-sectional views illustrating a method of manufacturing the image sensor of FIG. 1.

Referring to FIG. 6, a substrate 1 including a pad region PR, an optical black region OB, and/or a pixel region AP may be prepared. The substrate 1 may include a first surface 1a and a second surface 1b opposite to each other. For example, the substrate 1 may be a single-crystalline silicon wafer, a silicon epitaxial layer, or a silicon-on-insulator (SOI) substrate. For example, the substrate 1 may be doped with dopants of a first conductivity type. A photoelectric conversion portion 3 may be formed in the substrate 1 in each of unit pixels UP of the pixel region AP by injecting dopants of a second conductivity type opposite to the first conductivity type. A shallow trench isolation (STI) process may be performed on the substrate 1 to form a shallow device isolation pattern 5 in a portion adjacent to the first surface 1a of the substrate 1. The shallow device isolation pattern 5 may be formed between the pad region PR and the optical black region OB and between the optical black region OB and the pixel region AP. An ion implantation process may be performed to form a device isolation region 7 in a portion adjacent to the first surface 1a of the substrate 1 between the unit pixels UP of the pixel region AP. Transistors, an interlayer insulating layer 15, interconnection lines 17 and a first passivation layer 19 may be formed on the first surface 1a of the substrate 1.

Subsequently, the substrate 1 may be turned over such that the second surface 1b faces upward. A grinding process may be performed to remove a portion of the substrate 1 adjacent to the second surface 1b, and thus the substrate 1 may have a desired thickness. Next, etching processes may be selectively performed on the second surface 1b of the substrate 1 to form first to third deep trenches 1ta, 1to and 1tp and a recess region 1r. The first deep trenches 1ta may be formed to expose the device isolation region 7. The second and third deep trenches 1to and 1tp may expose the shallow device isolation pattern 5.

Figure 7:
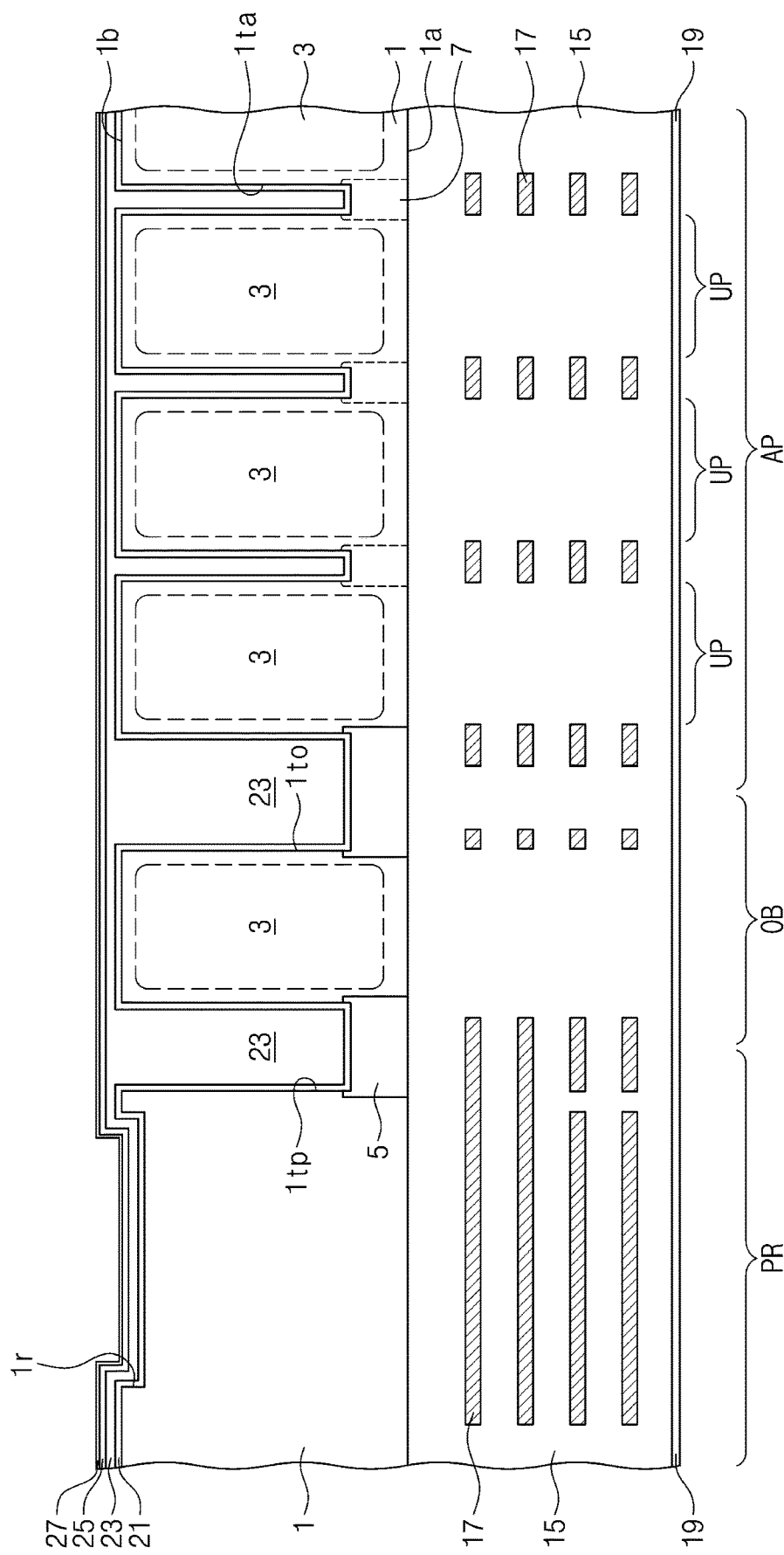

Referring to FIG. 7, a fixed charge layer 21 may be conformally formed on the whole of the second surface 1b of the substrate 1. The fixed charge layer 21 may be formed of a metal oxide or metal fluoride including at least one of hafnium (Hf), zirconium (Zr), aluminum (Al), tantalum (Ta), titanium (Ti), yttrium (Y), or a lanthanoid. A filling insulation layer 23 may be stacked on the fixed charge layer 21. The filling insulation layer 23 may fill the first to third deep trenches 1ta, 1to and 1tp. The filling insulation layer 23 may be conformally formed in the recess region 1r. The filling insulation layer 23 may be formed of a silicon oxide-based material having an excellent filling characteristic or a hafnium oxide layer. An adhesive layer 25 and a barrier layer 27 may be sequentially and conformally formed on the filling insulation layer 23. The adhesive layer 25 may be formed of, for example, an aluminum oxide layer. The barrier layer 27 may be formed of, for example, a silicon nitride layer.

Figure 8:
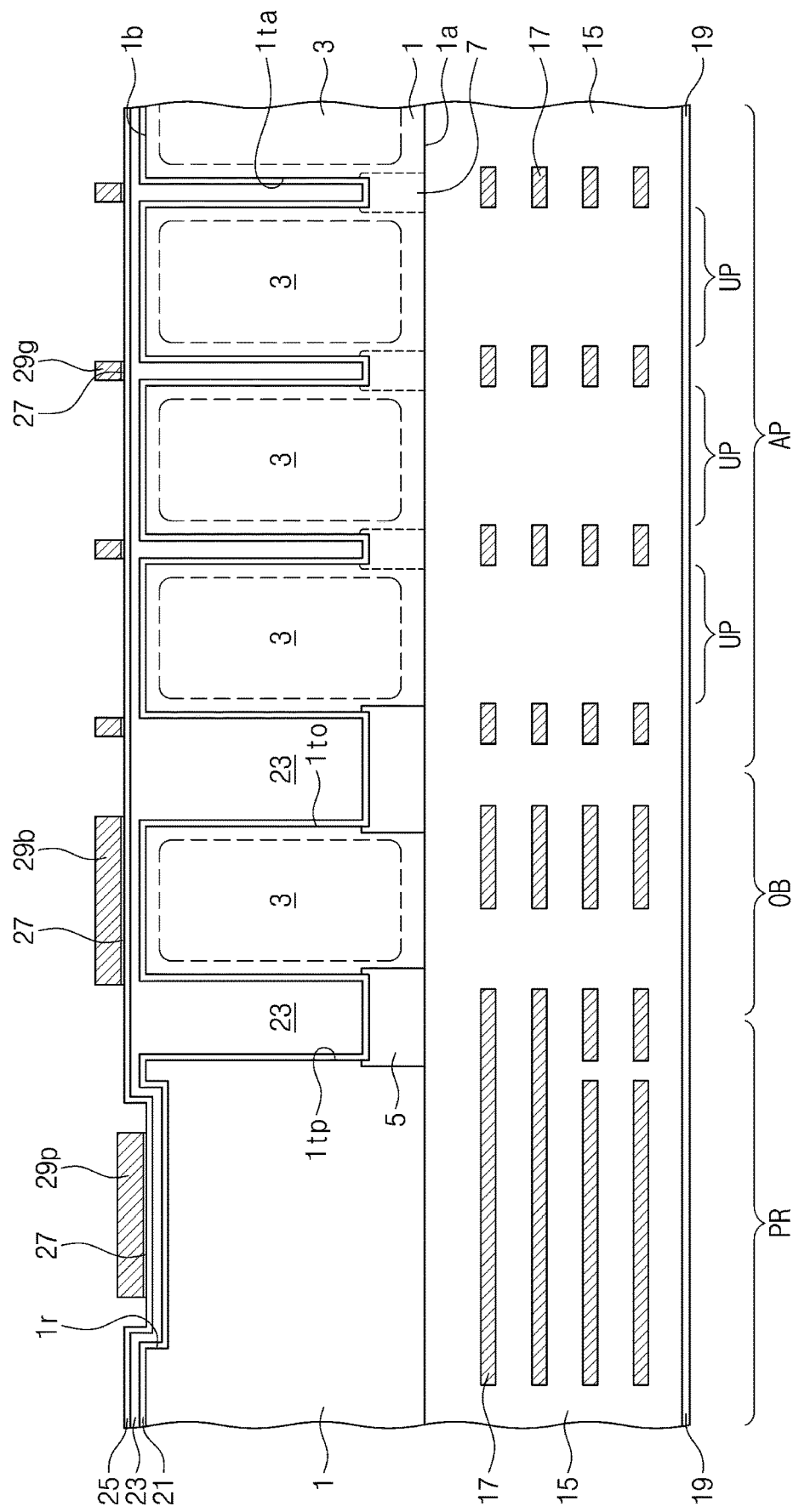

Referring to FIGS. 7 and 8, a first conductive layer (not shown) may be conformally formed on the barrier layer 27. The first conductive layer may include, for example, tungsten. The first conductive layer and the barrier layer 27 may be sequentially patterned to expose the adhesive layer 25. In addition, light blocking patterns 29g, a first optical black pattern 29b and a first conductive pad 29p may be formed by the patterning of the first conductive layer. At this time, the first conductive pad 29p may be formed in the recess region 1r.

Figure 9:
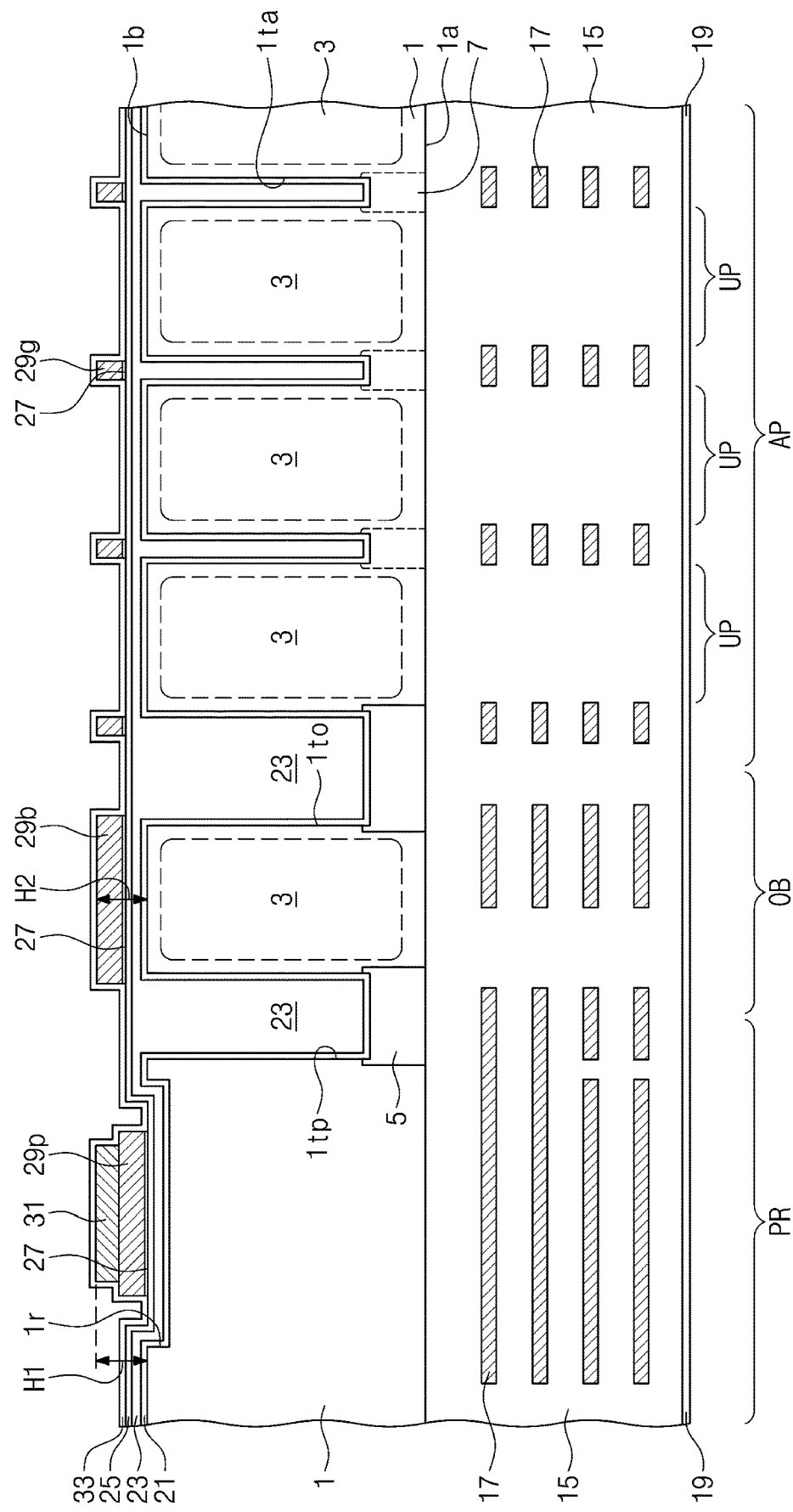

Referring to FIGS. 8 and 9, a second conductive pad 31 may be formed on the first conductive pad 29p. The second conductive pad 31 may be formed of, for example, aluminum. The second conductive pad 31 may be formed using a deposition process and an etching process. Alternatively, the second conductive pad 31 may be formed by performing a plating process using a separate mask pattern (not shown) which exposes a portion of a top surface of the first conductive pad 29p and fully covers the other portions. In particular, a first height H1 of a top surface of the second conductive pad 31 may be formed to be the same as a second height H2 of a top surface of the first optical black pattern 29b. A height of top surfaces of the light blocking patterns 29g may be the same as the second height H2. A second passivation layer 33 may be conformally formed on the whole of the second surface 1b of the substrate 1 on which the second conductive pad 31 is formed.

Figure 10:
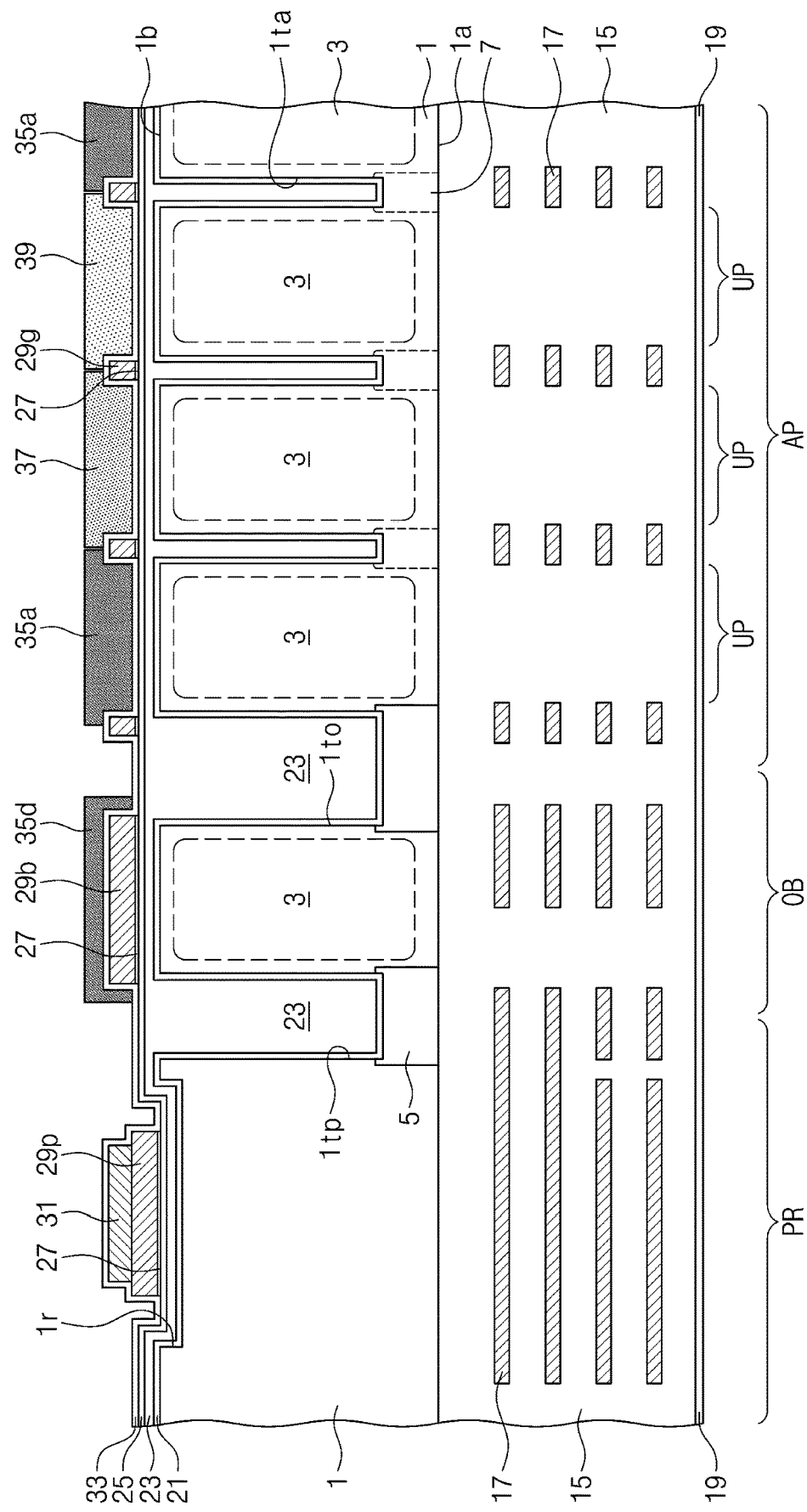

Referring to FIGS. 9 and 10, a photolithography process may be performed several times to form first to third color filters 35a, 37 and 39 and a second optical black pattern 35d on the second passivation layer 33. For example, a first photolithography process may be performed to form the first color filters 35a and the second optical black pattern 35d at the same time. To achieve this, the second surface 1b of the substrate 1 may be coated with a first photosensitive thermosetting resin solution containing a blue dye or pigment. At this time, since the first height H1 is the same as the second height H2 and the second passivation layer 33 is conformally formed, a height difference among the pad region PR, the optical black region OB and the pixel region AP may be reduced or minimized or may not occur. Thus, the first photosensitive thermosetting resin solution may be uniformly coated, and a striation defect may be reduced or minimized or may not occur. The first photosensitive thermosetting resin solution may be hardened by heating to form a first photoresist layer. An exposure process and a development process may be performed on the first photoresist layer to form the first color filters 35a and the second optical black pattern 35d. Thus, shapes of the first color filters 35a and the second optical black pattern 35d may be more accurately formed. Subsequently, second and third photolithography processes which are the same or similar as the first photolithography process may be sequentially performed to form the second and third color filters 37 and 39, respectively.

Figure 11:
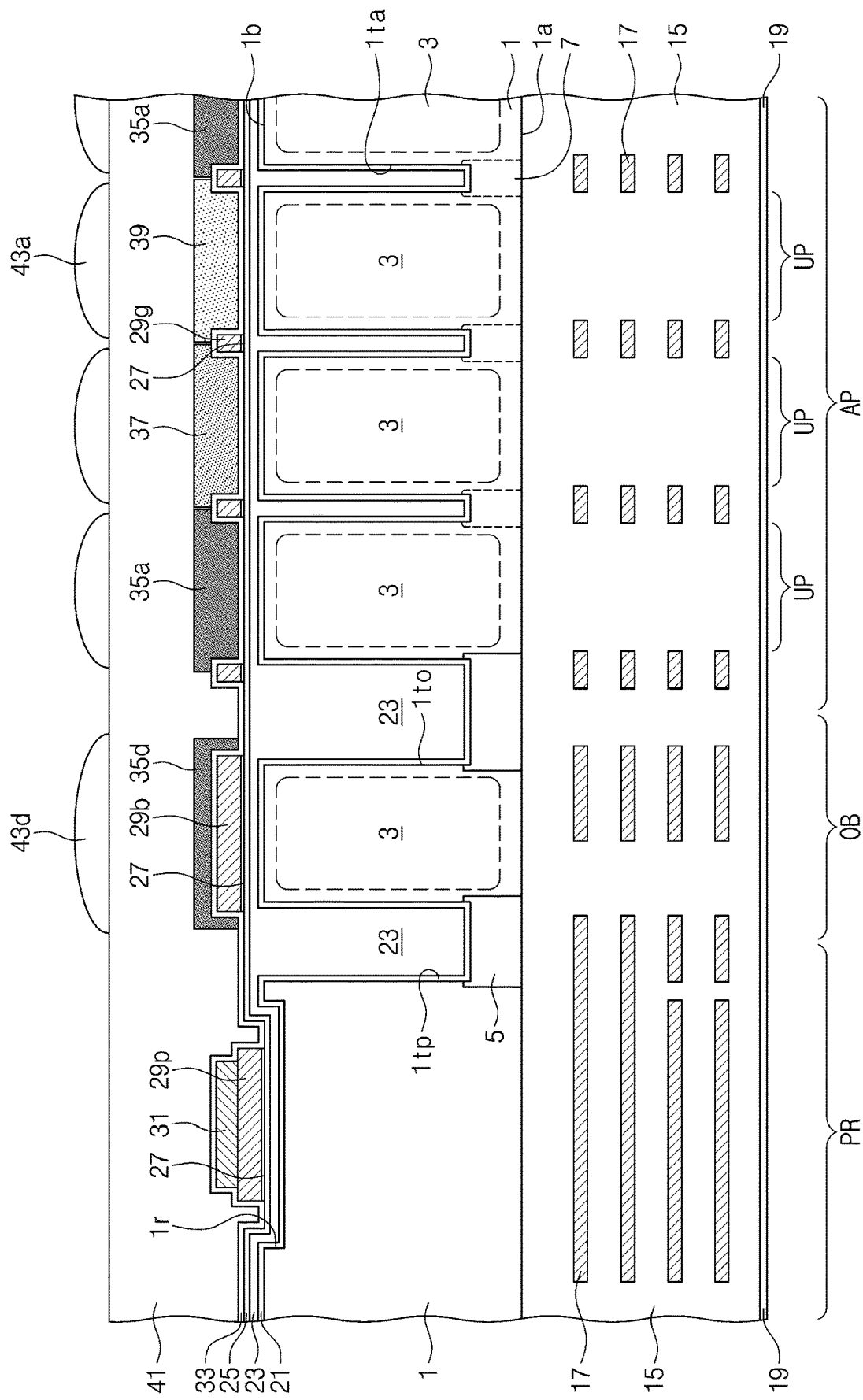

Referring to FIGS. 10 and 11, a preliminary lens layer 41 may be formed on the whole of the second surface 1b of the substrate 1 having the first to third color filters 35a, 37 and 39 and the second optical black pattern 35d. The preliminary lens layer 41 may be formed of a transparent photoresist material or a transparent thermosetting resin. Preliminary lens patterns 43a and a preliminary protective pattern 43d may be formed on the preliminary lens layer 41. The preliminary lens patterns 43a may be located to correspond to the unit pixels UP, respectively. The preliminary protective pattern 43d may be located in the optical black region OB. For example, photoresist patterns may be formed by a photolithography process, and then, a reflow process may be performed on the photoresist patterns to form the preliminary lens patterns 43a and the preliminary protective pattern 43d which have rounded shapes. At this time, densities of the preliminary lens patterns 43a and the preliminary protective pattern 43d may be increased by the reflow process, and thus chemical resistance thereof may be increased.

Figure 12:
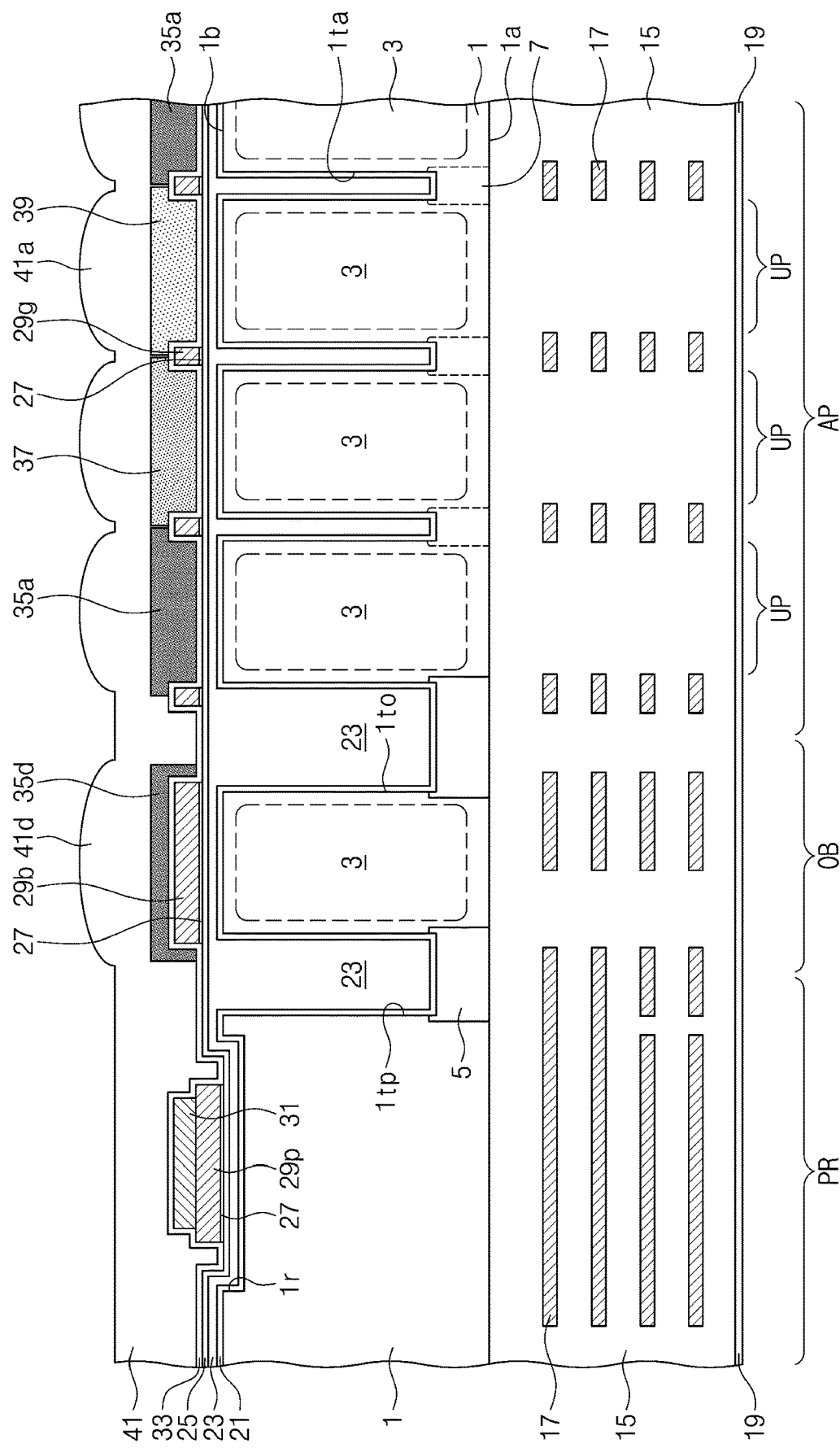

Referring to FIGS. 11 and 12, a blanket etching process may be performed on the preliminary lens layer 41. At this time, the preliminary lens patterns 43a and the preliminary protective pattern 43d may also be etched. The shapes of the preliminary lens patterns 43a and the preliminary protective pattern 43d may be transferred to the preliminary lens layer 41 to form a plurality of lens portions 41a and a second protective pattern 41d, which have convex shapes. During the blanket etching process, the pad region PR may be covered with the preliminary lens layer 41, and thus the second conductive pad 31 may be protected.

Referring to FIGS. 12 and 1, subsequently, a separation region SR exposing the second passivation layer 33 may be formed by etching the preliminary lens layer 41 between the pixel region AP and the optical black region OB and between the optical black region OB and the pad region PR, thereby forming a micro lens layer 41f, a first protective pattern 41p and/or a second protective pattern 41d, which are apart from each other. In the pad region PR, a portion of the first protective pattern 41p and a portion of the second passivation layer 33 may be removed to form an opening 32 exposing the top surface of the second conductive pad 31.

Although not shown in the drawings, a sawing process may be subsequently performed to divide the substrate of a wafer level into chips. In some example embodiments, if the micro lens layer 41f and the first and second protective patterns 41p and 41d are connected to each other without the separation region SR, stress occurring from an edge of the chip in the sawing process may be transferred to the micro lens layer 41f, and thus a crack may occur in the micro lens layer 41f. However, according to some embodiments of the inventive concepts, the micro lens layer 41f and the first and second protective patterns 41p and 41d may be apart from each other by the separation region SR, and thus the transfer of the stress occurring in the sawing process may be reduced or prevented. As a result, reliability of the image sensor may be improved.

In addition, according to some embodiments of the inventive concepts, the preliminary lens layer 41 of the pad region PR may not be removed but may remain to protect the pad region PR in the etching process for forming the shapes of the lens portions 41a. Thus, an additional pad capping pattern for protecting the second conductive pad 31 may not be required. As a result, manufacturing processes may be simplified. Therefore, a process yield may be improved. Furthermore, a height difference caused by the pad capping pattern may not occur, and thus the color filters 35a, 37 and 39 may be more accurately formed without a striation defect. As a result, the image sensor capable of reducing or minimizing an image defect and of realizing an accurate image may be provided.

Figure 13:
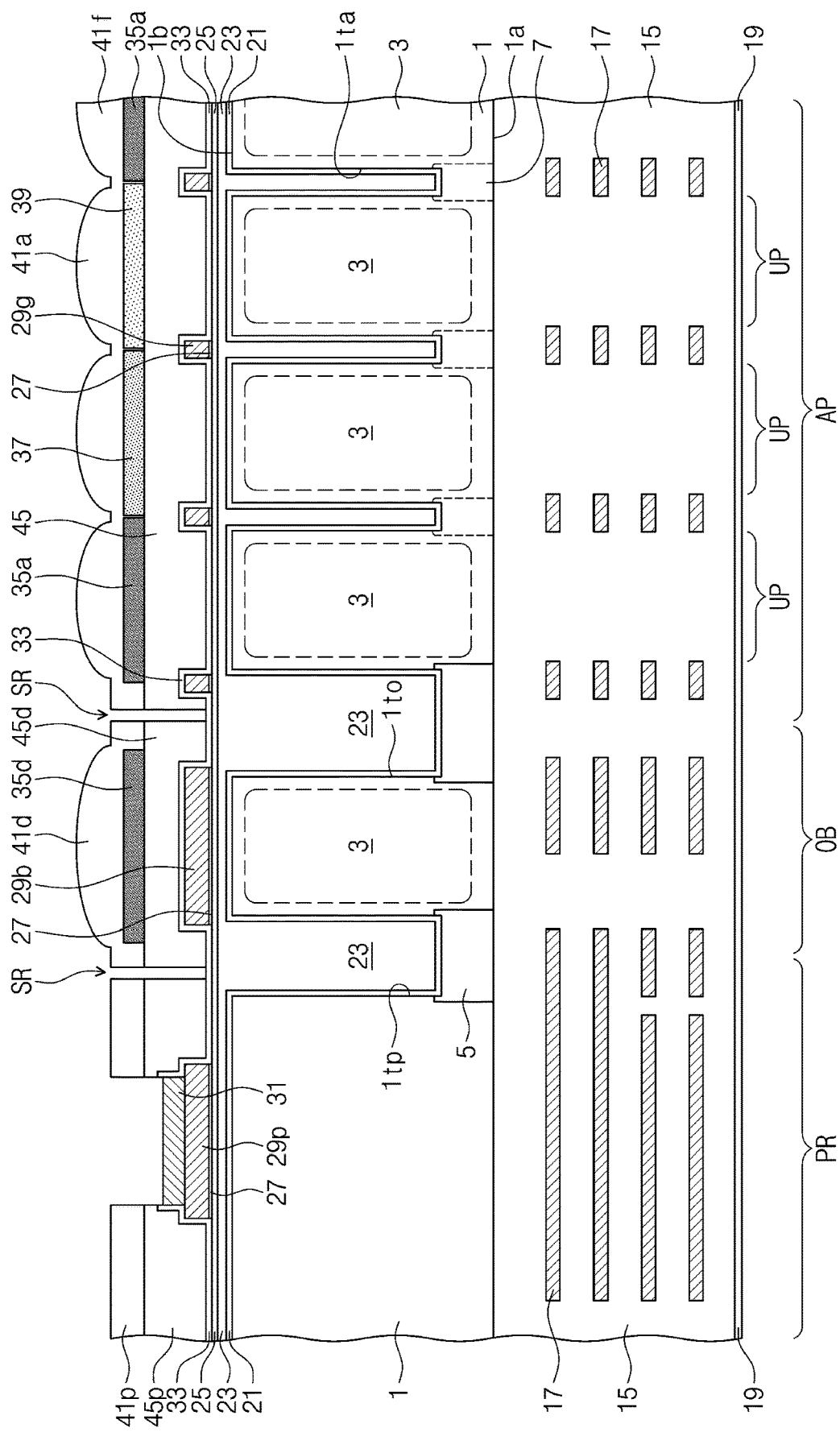
FIG. 13 is a cross-sectional view illustrating an image sensor according to some embodiments of the inventive concepts.

FIG. 13 is a cross-sectional view illustrating an image sensor according to some embodiments of the inventive concepts.

Referring to FIG. 13, a first planarization pattern 45p may be between a second passivation layer 33 and a first protective pattern 41p. A second planarization pattern 45d may be between the second passivation layer 33 and a second protective pattern 41d. A planarization layer 45 may be between the micro lens layer 41f and the second passivation layer 33. The planarization layer 45 and the first and second planarization patterns 45p and 45d may be formed of the same or similar transparent photoresist material or transparent thermosetting resin as the micro lens layer 41f. In some embodiments, the recess region 1r of FIG. 1 may not exist. Color filters 35a, 37 and 39 may be between the planarization layer 45 and the micro lens layer 41f. A second optical black pattern 35d may be between the second planarization pattern 45d and the second protective pattern 41d. A height of a bottom surface of the second optical black pattern 35d may be the same as heights of bottom surfaces of the first to third color filters 35a, 37 and 39. A separation region SR may separate the planarization layer 45, the first planarization pattern 45p and the second planarization pattern 45d from each other. Other structures and/or features of the image sensor according to the present embodiments may be the same or similar as described with reference to FIG. 1.

Figure 14:
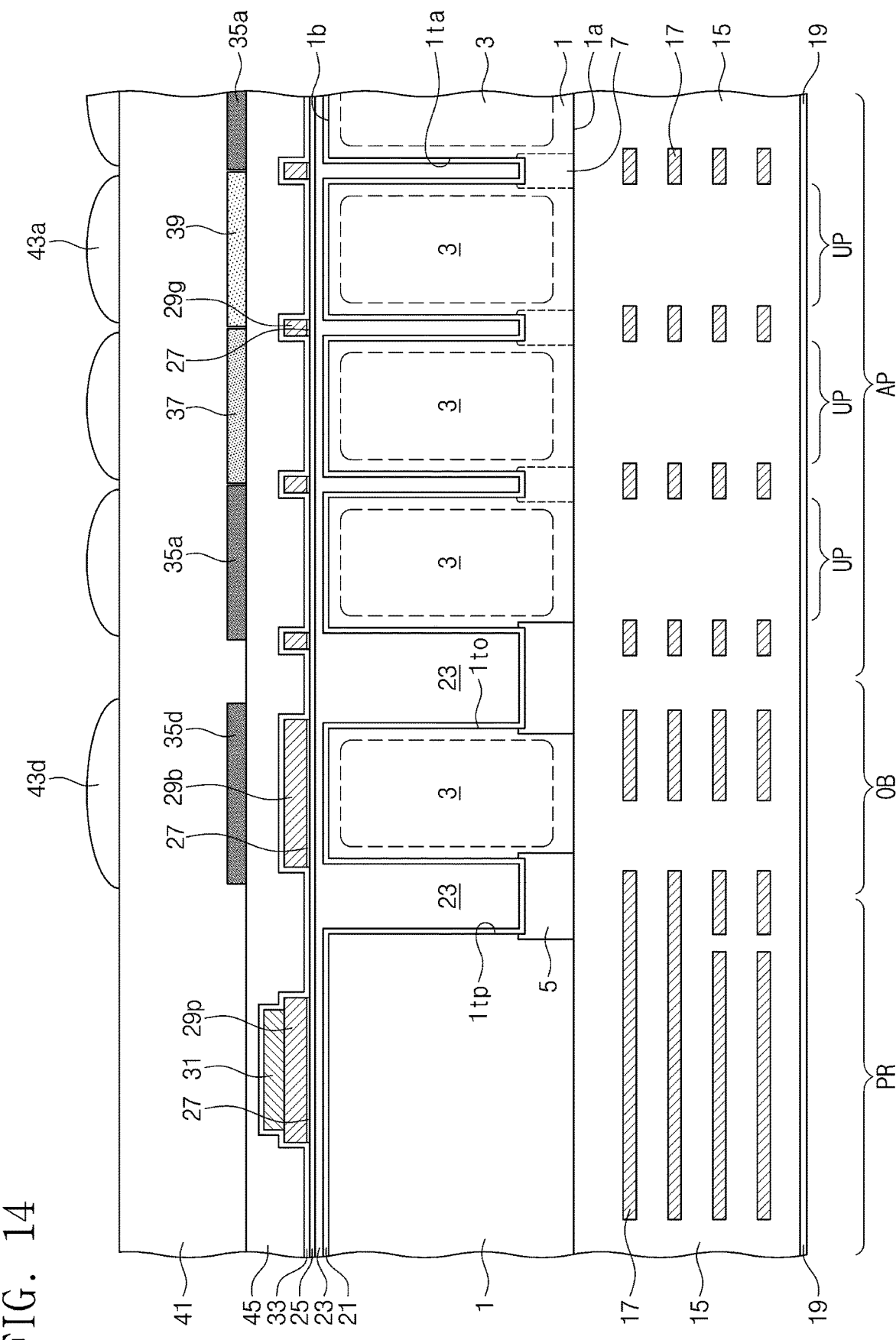
FIGS. 14 and 15 are cross-sectional views illustrating a method of manufacturing the image sensor of FIG. 13.
Figure 15:
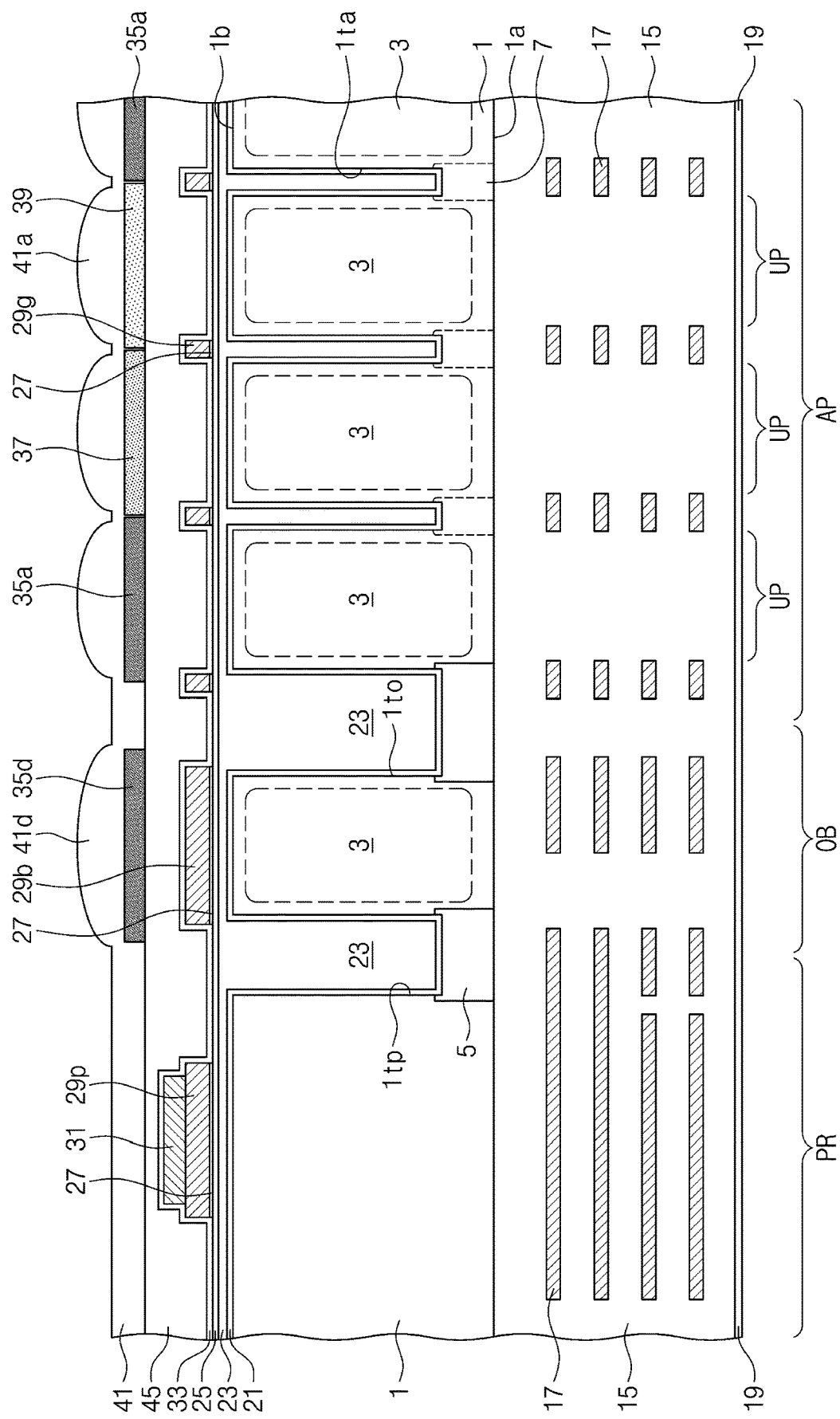

FIGS. 14 and 15 are cross-sectional views illustrating a method of manufacturing the image sensor of FIG. 13.

In a method of manufacturing the image sensor of FIG. 13, the processes described with reference to FIGS. 6 to 9 except the process of forming the recess region 1r in FIG. 6 may be performed. Referring to FIG. 14, a planarization layer 45 may be formed on the second passivation layer 33. A transparent thermosetting resin solution may be coated and then may be thermally hardened to form the planarization layer 45. The planarization layer 45 may be formed to have a flat top surface. A height difference between the regions PR, OB and AP may be eliminated by the planarization layer 45. A several number of photolithography processes may be performed to form color filters 35a, 37 and 39 and a second optical black pattern 35d on the planarization layer 45. A preliminary lens layer 41 may be formed on the first to third color filters 35a, 37 and 39, the second optical black pattern 35d, and the planarization layer 45. The preliminary lens layer 41 may be formed of a transparent photoresist material or a transparent thermosetting resin. Preliminary lens patterns 43a and a preliminary protective pattern 43d may be formed on the preliminary lens layer 41.

Referring to FIG. 15, a blanket etching process may be performed on the preliminary lens layer 41. In some example embodiments, the preliminary lens patterns 43a and the preliminary protective pattern 43d may also be etched. The shapes of the preliminary lens patterns 43a and the preliminary protective pattern 43d may be transferred to the preliminary lens layer 41 to form a plurality of lens portions 41a and a second protective pattern 41d, which have convex shapes. During the blanket etching process, the pad region PR may be covered with the preliminary lens layer 41, and thus the second conductive pad 31 may be protected.

Referring again to FIGS. 15 and 13, a separation region SR exposing the second passivation layer 33 may be formed by etching the preliminary lens layer 41 and the planarization layer 45 between the pixel region AP and the optical black region OB and between the optical black region OB and the pad region PR, thereby forming a micro lens layer 41f, a first protective pattern 41p and a second protective pattern 41d apart from each other and forming a planarization layer 45, a first planarization pattern 45p and a second planarization pattern 45d apart from each other thereunder. In the pad region PR, portions of the first protective pattern 41p, the first planarization pattern 45p and the second passivation layer 33 may be removed to form an opening 32 exposing the top surface of the second conductive pad 31.

Figure 16:
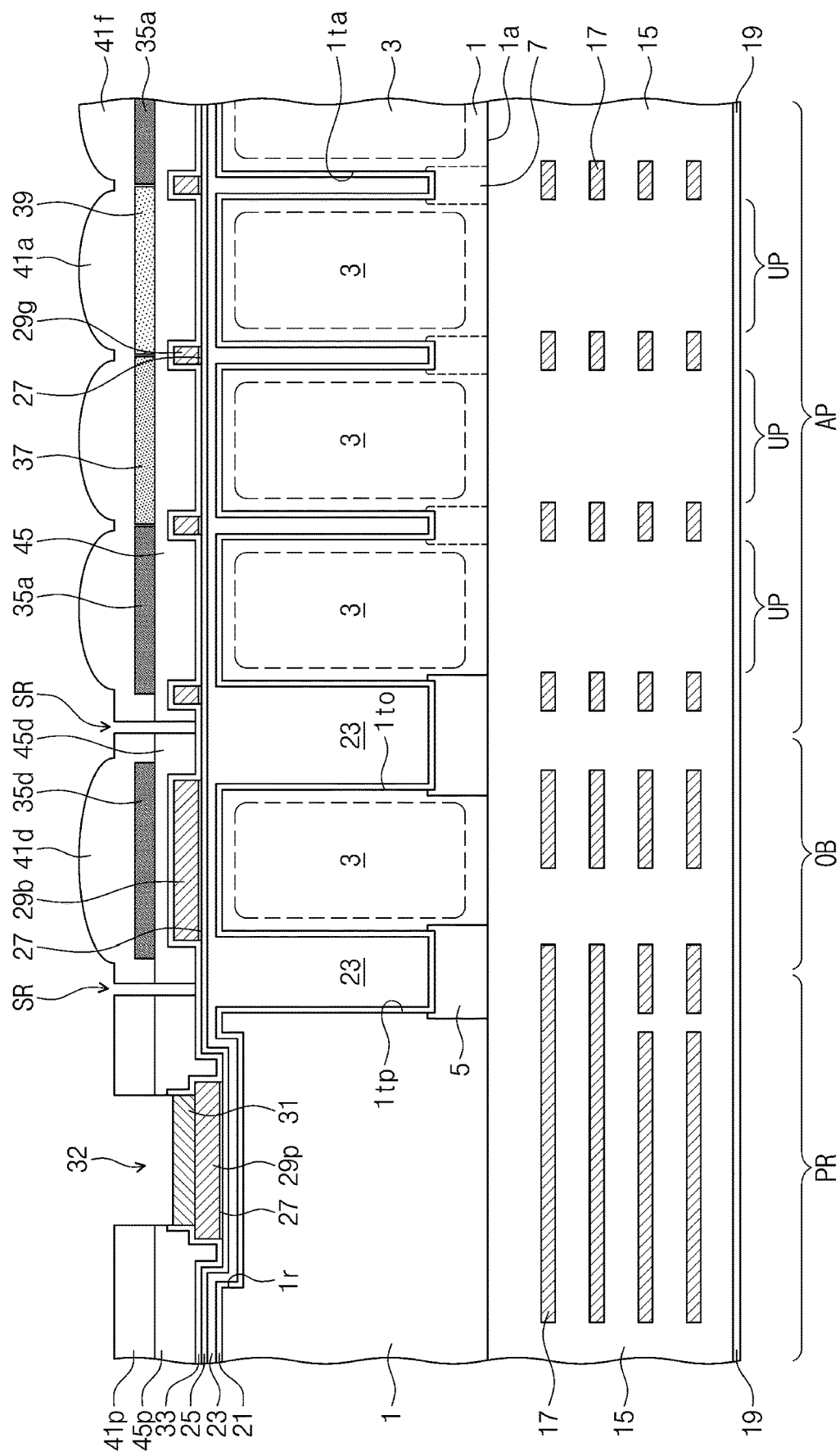
FIG. 16 is a cross-sectional view illustrating an image sensor according to some embodiments of the inventive concepts.

FIG. 16 is a cross-sectional view illustrating an image sensor according to some embodiments of the inventive concepts.

An embodiment of FIG. 16 may correspond to a combination of the embodiments of FIGS. 1 and 13. An image sensor of FIG. 16 may include the planarization layer 45, the first planarization pattern 45p and the second planarization pattern 45d like FIG. 13 and may also include the recess region 1r of FIG. 1. Other components of the image sensor may be the same or similar as described with reference to FIGS. 1 and 13.

Figure 17:
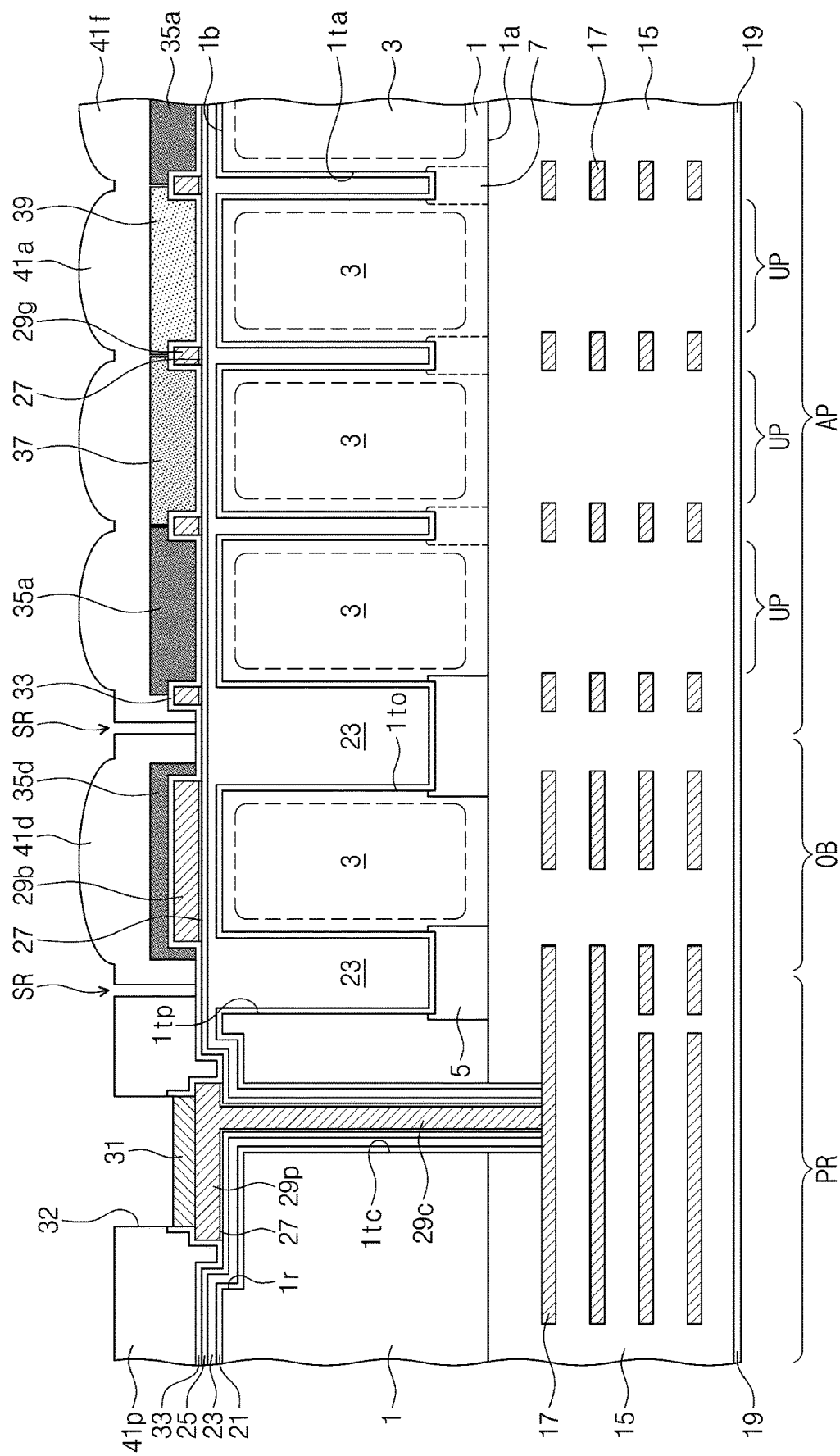
FIG. 17 is a cross-sectional view illustrating an image sensor according to some embodiments of the inventive concepts.

FIG. 17 is a cross-sectional view illustrating an image sensor according to some embodiments of the inventive concepts.

Referring to FIG. 17, in an image sensor according to the present embodiment, a first conductive pad 29p may be electrically connected to one of the interconnection lines 17 through a via plug 29c. The via plug 29c may be formed of the same material as the first conductive pad 29p. The via plug 29c may be referred to as a back via stack plug or a through silicon via (TSV). Although not shown in the drawings, a portion of the first conductive pad 29p may extend adjacent to the second surface 1b of the substrate 1 so as to be used as an interconnection line. The via plug 29c may be in a via hole 1tc. The via hole 1tc may penetrate the substrate 1 and a portion of the interlayer insulating layer 15. The fixed charge layer 21, the filling insulation layer 23, the adhesive layer 25 and the barrier layer 27 may be between an inner sidewall of the via hole 1tc and the via plug 29c and may function as an insulating spacer. Other components of the image sensor may be the same or similar as described with reference to FIG. 1.

In the image sensor of FIG. 17, the via hole 1tc may be formed simultaneously with the recess region 1r or may be formed after the formation of the recess region 1r. The via plug 29c may be formed simultaneously with the first conductive pad 29p. Other manufacturing processes may be the same or similar as described with reference to FIGS. 6 to 12.

In the image sensor according to some embodiments of the inventive concepts, the protective pattern covering the pad region may be apart from the micro lens layer. Thus, it is possible to reduce or prevent the transfer of stress occurring in the sawing process. As a result, the reliability of the image sensor may be improved.

In the image sensor according to some embodiments of the inventive concepts, the conductive pad may be in the recess region formed in the substrate. Thus, it is possible to reduce or eliminate a height difference between the pad region and other regions. As a result, the color filters may be more accurately formed, and thus an image defect may be reduced or minimized and a more accurate image may be realized.

In addition, in the method of manufacturing the image sensor according to some embodiments of the inventive concepts, the protective pattern protecting the pad region may be formed of a portion of the micro lens layer, and thus an additional pad capping pattern may not be required. As a result, the manufacturing processes may be simplified. Moreover, a height difference by the pad capping pattern may not occur, and thus the color filters may be more accurately formed.

While the inventive concepts have been described with reference to example embodiments, it will be apparent to those skilled in the art that various changes and modifications may be made without departing from the spirits and scopes of the inventive concepts. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. An image sensor comprising:
a substrate including a pixel region and a pad region and including a first surface and a second surface opposite to the first surface;
a first conductive pad on the second surface of the substrate in the pad region;
a micro lens layer on the second surface of the substrate in the pixel region; and
a first protective pattern covering the pad region and exposing the first conductive pad,
wherein the first protective pattern and the micro lens layer include the same material,
wherein the first protective pattern overlaps both edges of the first conductive pad, and
wherein the first protective pattern and the micro lens layer are separated by a separation region.

2. The image sensor of claim 1, further comprising:
a passivation layer covering the second surface of the substrate in the pad region and the pixel region,
wherein the passivation layer is between the second surface of the substrate and the first protective pattern and between the second surface of the substrate and the micro lens layer, and
wherein the passivation layer is exposed between the first protective pattern and the micro lens layer.

3. The image sensor of claim 1, further comprising:
a recess region in the second surface of the substrate in the pad region,
wherein the first conductive pad vertically overlaps with the recess region.

4. The image sensor of claim 1, wherein the substrate further includes an optical black region; and
a second protective pattern on the second surface of the substrate in the optical black region,
wherein the second protective pattern and the micro lens layer include the same material.

5. The image sensor of claim 4, wherein the second protective pattern is separated from both the first protective pattern and the micro lens layer by corresponding separation regions.

6. The image sensor of claim 4, further comprising:
a first optical black pattern between the second protective pattern and the second surface of the substrate in the optical black region,
wherein a height of a top surface of the first conductive pad is the same as a height of a top surface of the first optical black pattern.

7. The image sensor of claim 6, further comprising:
a second optical black pattern between the first optical black pattern and the second protective pattern; and
a plurality of color filters between the micro lens layer and the second surface of the substrate in the pixel region,
wherein the second optical black pattern includes the same material as one of the color filters.

8. The image sensor of claim 7, wherein the second optical black pattern covers a top surface and both sidewalls of the first optical black pattern.

9. The image sensor of claim 6, further comprising:
a second conductive pad between the first conductive pad and the substrate in the pad region,
wherein a thickness of the second conductive pad is equal to a thickness of the first optical black pattern.

10. The image sensor of claim 4, wherein a top surface of the second protective pattern is convex.

11. The image sensor of claim 1, further comprising:
a first planarization pattern between the second surface of the substrate and the first protective pattern; and
a second planarization pattern between the second surface of the substrate and the micro lens layer,
wherein the first planarization pattern and the second planarization pattern include the same material and are apart from each other.

12. The image sensor of claim 11, wherein a sidewall of the first planarization pattern is aligned with a sidewall of the first protective pattern, and
wherein a sidewall of the second planarization pattern is aligned with a sidewall of the micro lens layer.

13. The image sensor of claim 1, wherein a height of a top surface of the first protective pattern is the same as a height of a top end of an edge of the micro lens layer.

14. The image sensor of claim 1, further comprising:
an interlayer insulating layer on the first surface of the substrate;

an interconnection line in the interlayer insulating layer; and
a via plug penetrating the substrate and a portion of the interlayer insulating layer to electrically connect the first conductive pad and the interconnection line.

15. The image sensor of claim 14, further comprising:
a fixed charge layer and a filling insulation layer sequentially stacked on the second surface of the substrate,
wherein the fixed charge layer and the filling insulation layer extend between the substrate and the via plug.

16. An image sensor comprising:
a substrate including a pixel region, an optical black region, and a pad region;
a first conductive pad on the substrate in the pad region;
a micro lens layer on the substrate in the pixel region;
a first protective pattern covering the pad region and exposing the first conductive pad; and
a second protective pattern on the substrate in the optical black region,
wherein the first protective pattern and the second protective pattern are transparent,
wherein the first protective pattern overlaps both edges of the first conductive pad, and
wherein the first protective pattern and the micro lens layer are separated by a separation region.

17. The image sensor of claim 16, wherein the micro lens layer, the first protective pattern and the second protective pattern are of the same material and are separated from each other by corresponding separation regions.

18. The image sensor of claim 16, wherein a top surface of the second protective pattern is convex.

19. The image sensor of claim 16, further comprising:
a first optical black pattern between the second protective pattern and the substrate in the optical black region;
a second optical black pattern between the first optical black pattern and the second protective pattern; and
a plurality of color filters between the micro lens layer and the substrate in the pixel region,
wherein the second optical black pattern includes the same material as one of the color filters.

* * * * *